(12) United States Patent
Horng et al.

(10) Patent No.: US 8,624,262 B2
(45) Date of Patent: Jan. 7, 2014

(54) LIGHT EMITTING DIODE

(75) Inventors: Ray-Hua Horng, Taichung (TW); Dong-Sing Wuu, Taichung (TW)

(73) Assignee: Ray-Hua Horng, Taichung (TW)

(*) Notice: Subject to any disclaimer, the term of this patent is extended or adjusted under 35 U.S.C. 154(b) by 81 days.

(21) Appl. No.: 12/903,852

(22) Filed: Oct. 13, 2010

(65) Prior Publication Data
US 2011/0024783 A1    Feb. 3, 2011

(51) Int. Cl.
*H01L 29/15*   (2006.01)
*H01L 31/0312* (2006.01)
*H01L 33/00*   (2010.01)

(52) U.S. Cl.
USPC .................. 257/77; 257/98; 257/E33.068

(58) Field of Classification Search
None
See application file for complete search history.

(56) References Cited

U.S. PATENT DOCUMENTS

| | | | |
|---|---|---|---|
| 5,243,204 A * | 9/1993 | Suzuki et al. ............ | 257/77 |
| 5,487,999 A | 1/1996 | Farnworth | |
| 2006/0011923 A1 | 1/2006 | Eisert et al. | |
| 2008/0035948 A1 | 2/2008 | Shin et al. | |
| 2009/0127575 A1 | 5/2009 | Horng et al. | |
| 2009/0141502 A1 | 6/2009 | Sonoda et al. | |
| 2009/0295266 A1 * | 12/2009 | Ramer et al. ................. | 313/113 |

FOREIGN PATENT DOCUMENTS

| | | |
|---|---|---|
| JP | 2007227895 | 9/2007 |
| TW | 200735399 | 9/2007 |
| TW | 200739969 | 10/2007 |
| TW | 200915603 A | 4/2009 |

OTHER PUBLICATIONS

Liang, Yung-Lung, "Investigation of Improving External Quantum Efficiency of AlGaInP-based LEDs by Roughened Window Layer," National Chung Hsing University—Master Thesis, Jul. 6, 2006.

* cited by examiner

*Primary Examiner* — Fernando L Toledo
*Assistant Examiner* — Valerie N Newton
(74) *Attorney, Agent, or Firm* — Rajesh Vallabh; Foley Hoag LLP

(57) ABSTRACT

A light emitting diode includes: an electrically conductive permanent substrate having a reflective top surface; an epitaxial film disposed on the reflective top surface of the permanent substrate and having an upper surface and a roughened lower surface that is opposite to the upper surface, the roughened lower surface having a roughness with a height of not less than 300 nm and a plurality of peaks which are in ohmic contact with the reflective top surface; an optical adhesive filled in a gap between the lower surface and the reflective top surface and connecting the epitaxial film to the permanent substrate; and a top electrode disposed on the upper surface and in ohmic contact with the epitaxial film.

5 Claims, 5 Drawing Sheets

US 8,624,262 B2

LIGHT EMITTING DIODE

BACKGROUND OF THE INVENTION

1. Field of the Invention

This invention relates to a light emitting diode, more particularly to a light emitting diode with an optical adhesive present between an epitaxial film and a permanent substrate.

2. Description of the Related Art

Referring to FIG. 1, a conventional vertically structured light emitting diode (LED) 1 includes a permanent substrate 11, an epitaxial film 12 disposed on the permanent substrate 11 and generating light when electricity is supplied, and a top electrode 14 disposed on the epitaxial film 12.

The permanent substrate 11 is electrically conductive and the electricity may be supplied to the epitaxial film by virtue of electrical connection between the permanent substrate 11 and the top electrode 14. The permanent substrate 11 includes a base plate 111 and a reflective film 112 formed between the base plate 111 and the epitaxial film 12 for reflecting light.

The epitaxial film 12 is formed by growing epitaxially a gallium nitride series semiconductor material on an epitaxial substrate (not shown), and then is transferred to so as to be in ohmic contact with the permanent substrate 11 using a temporary substrate (not shown). The epitaxial film 12 includes p-doped and n-doped cladding layers 121,122, and an active layer 123 that is formed between the p-doped and n-doped cladding layers 121,122. A band gap exists between the p-doped and n-doped cladding layers 121,122. When electricity is supplied to the epitaxial film 12, recombination of electron-hole pairs occurs in the active layer 123, thereby releasing energy in a form of light. In order to improve the light emitting efficiency of the LED 1, an upper surface 124 of the epitaxial film 12 (i.e., an upper surface of the n-doped cladding layer 122) is roughened so as to reduce full reflection of the light generated from the epitaxial film 12. As a result, high proportion of the light generated from the active layer 123 can be directly emitted out of the LED 1 through the upper surface 124.

During production of the LED 1, the gallium nitride series semiconductor material is epitaxially grown on the epitaxial substrate, followed by doping to form the epitaxial film 12. Thereafter, the permanent substrate 11 is wafer-bonded to the epitaxial film 12, and the epitaxial substrate is removed to expose the upper surface 124 of the epitaxial film 12, followed by roughening the upper surface 124 and disposing the top electrode 14 on the roughened upper surface 124 to obtain the LED 1.

In the conventional LED 1, because the epitaxial film 12 and the permanent substrate 11 are connected only by wafer bonding, the connecting surfaces between the epitaxial film 12 and the permanent substrate 11 should be sufficiently flat so that the epitaxial film 12 is tightly bonded to the permanent substrate 11. Furthermore, in order to ensure a uniform ohmic contact between the permanent substrate 11 and the epitaxial film 12, the wafer bonding process is required to be conducted at a temperature ranging from 200° C. to 400° C. As a result, the reflective film 112 of the permanent substrate 11 may have a degraded quality on account of the high temperature. Accordingly, the reflectivity of the reflective film 112 may be adversely affected and the light emitting efficiency of the LED 1 may be lowered.

SUMMARY OF THE INVENTION

Therefore, an object of the present invention is to provide a light emitting diode that can overcome the aforesaid drawbacks associated with the prior art.

Accordingly, a light emitting diode of this invention comprises:

an electrically conductive permanent substrate having a reflective top surface;

an epitaxial film disposed on the reflective top surface of the permanent substrate and having an upper surface and a roughened lower surface that is opposite to the upper surface, the roughened lower surface having a roughness with a height of not less than 300 nm and a plurality of peaks which are in ohmic contact with the reflective top surface;

an optical adhesive filled in a gap between the lower surface and the reflective top surface and connecting the epitaxial film to the permanent substrate; and a top electrode disposed on the upper surface and in ohmic contact with the epitaxial film.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
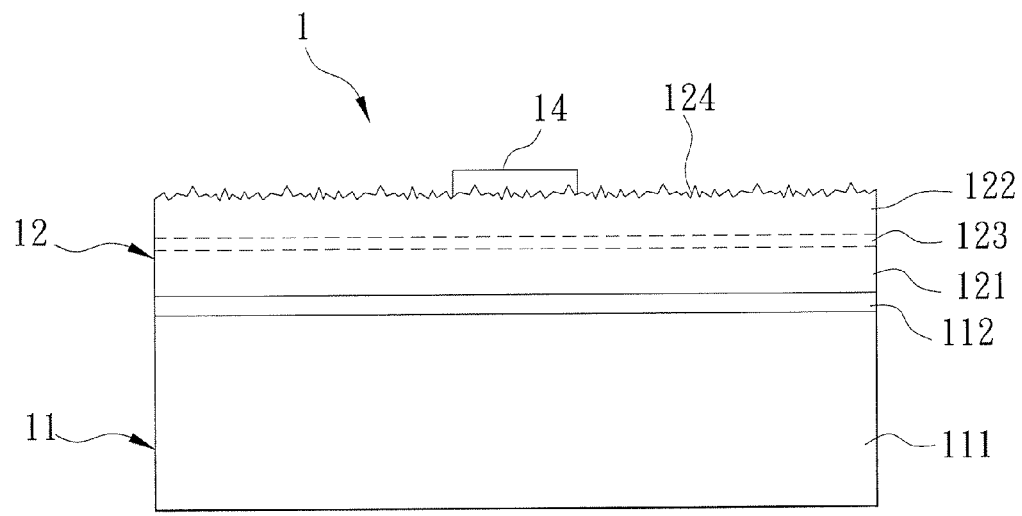
FIG. 1 is a schematic diagram of a conventional vertically structured light emitting diode.

Before the present invention is described in greater detail with reference to the accompanying preferred embodiments, it should be noted herein that like elements are denoted by the same reference numerals throughout the disclosure.

Figure 2:
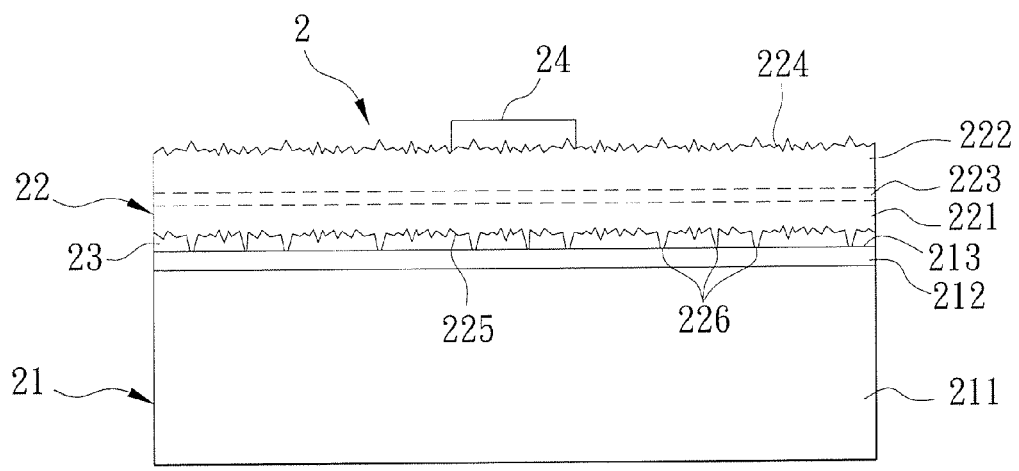
FIG. 2 is a schematic diagram of the first preferred embodiment of a light emitting diode according to the present invention.

Referring to FIG. 2, a light emitting diode (LED) 2 according to the first preferred embodiment of the present invention includes an electrically conductive permanent substrate 21, an epitaxial film 22, an optical adhesive 23, and a top electrode 24.

Electricity is supplied to the epitaxial film 22 through the permanent substrate 21 and the top electrode 24. The permanent substrate 21 includes a base plate 211 and a reflective film 212 formed on the base plate 211 to have a reflective top surface 213. Preferably, the base plate 211 is made of a metal or an alloy, and the reflective film 212 is made of an alloy or a metal that has a relatively high reflectivity, so that the permanent substrate 11 is thermally and electrically conductive and reflective. Accordingly, the permanent substrate 21 is capable of dissipating heat generated from the epitaxial film 22 and is capable of reflecting light. Alternatively, the reflective film 212 may be made of a lamination of dielectric layers having different refraction coefficients. Besides, the base plate 211 may be made of any thermally and electrically conductive composite material or semiconductor material suitable for this purpose.

Figure 6:
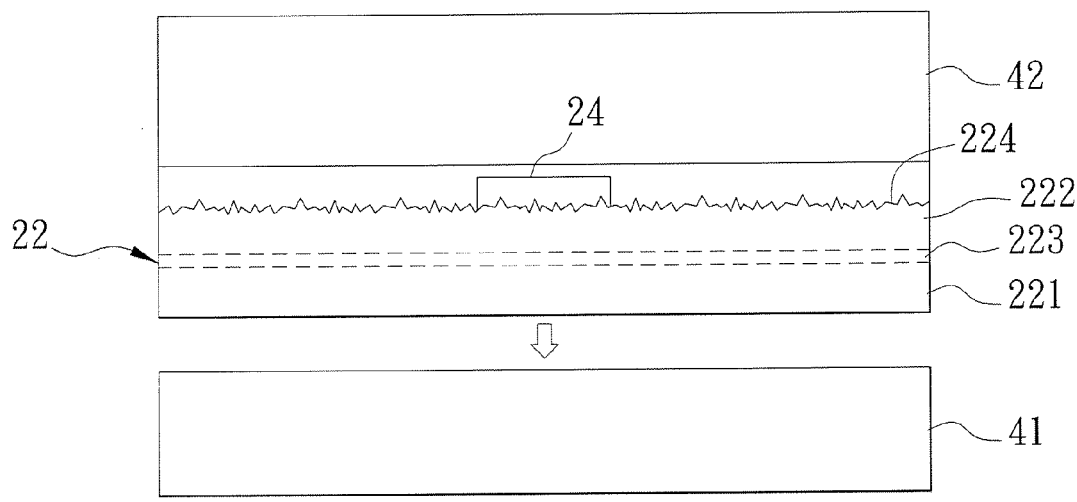
FIG. 6 is a schematic diagram illustrating that a temporary substrate is detachably attached over the roughened upper surface and that the epitaxial substrate is removed from the epitaxial film according to the method in FIG. 3.
Figure 7:
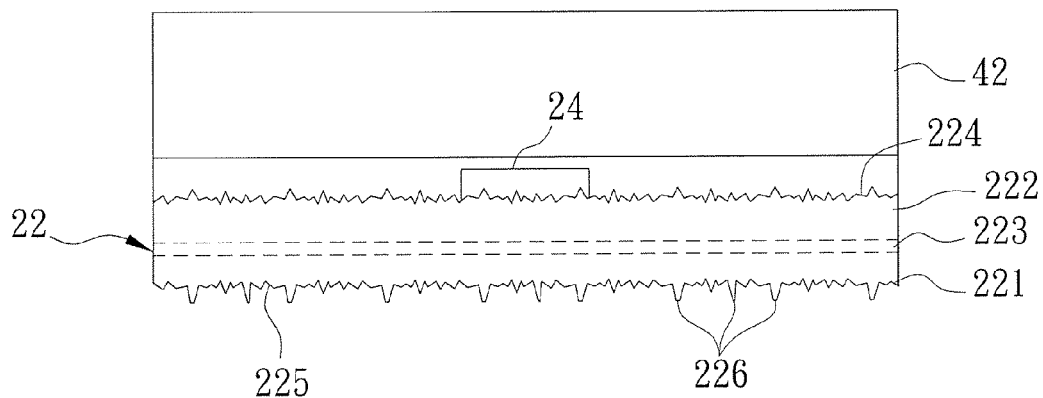
FIG. 7 is a schematic diagram illustrating that a lower surface of the epitaxial film is roughened according to the method in FIG. 3.
Figure 8:
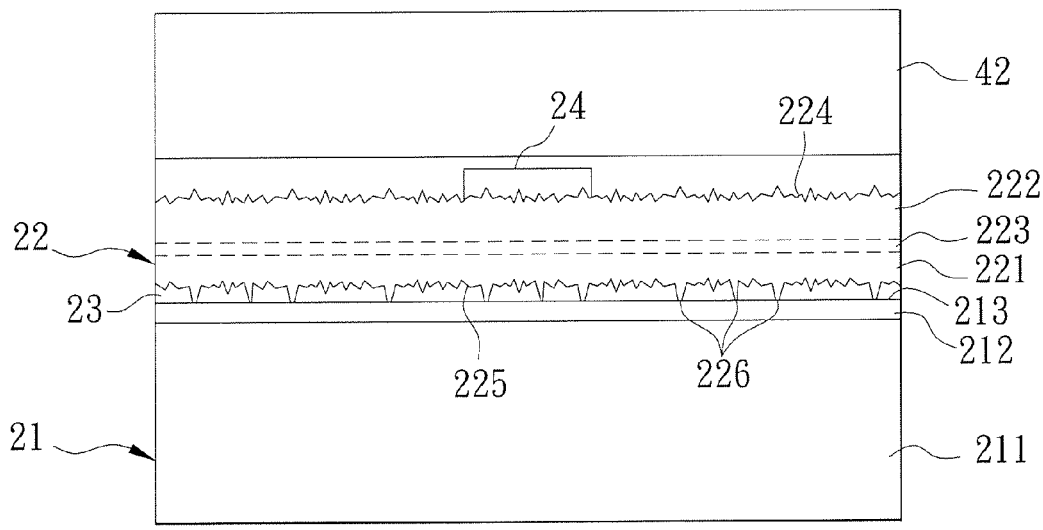
FIG. 8 is a schematic diagram illustrating that an electrically conductive permanent substrate is adhered to the roughened lower surface of the epitaxial film using an optical adhesive according to the method in FIG. 3.

The epitaxial film 22 is disposed on the reflective top surface 213 of the reflective film 212 of the permanent substrate 21, generates light when the electricity is supplied, and is formed by growing epitaxially a gallium nitride series semiconductor material on an epitaxial substrate 41 (see FIG. 4), followed by transferring the same to the permanent substrate 21 using a temporary substrate 42 (see FIGS. 6 to 8). The epitaxial film 22 includes p-doped and n-doped cladding layers 221,222, and an active layer 223 that is formed between the p-doped and n-doped cladding layers 221,222. A band gap exists between the p-doped and n-doped cladding layers 221,222. When electricity is supplied to the epitaxial film 22, recombination of electron-hole pairs occurs in the active layer 223, thereby releasing energy in a form of light. Preferably, the epitaxial film 22 has an upper surface 224 and a roughened lower surface 225. In this preferred embodiment, the upper surface 224 is also roughened. The p-doped cladding layer 221 has the roughened upper surface 224, and the n-doped cladding layer 222 has the roughened lower surface 225. The roughened lower surface 225 has a roughness with a height of not less than 300 nm and a plurality of peaks 226 which are in ohmic contact with the reflective top surface 213.

The optical adhesive 23 is filled in a gap between the roughened lower surface 225 and the reflective top surface 213 and connects the epitaxial film 22 to the permanent substrate 21. In this case, the optical adhesive 23 is light-transmissive, adhesive, and may refract or reflect the light generated from the epitaxial film 22 so that a traveling direction of the light toward the permanent substrate 21 may be changed substantially. Preferably, the optical adhesive 23 is a thermosetting adhesive. More preferably, the optical adhesive 23 is electrically conductive and is liquid at a temperature ranging from 180° C. to 200° C.

The top electrode 24 is made of an electrically conductive material and is disposed on the roughened upper surface 224 of the epitaxial film 22 and in ohmic contact with the epitaxial film 22. Accordingly, the electricity may be supplied to the epitaxial film 22 through the permanent substrate 21 and the top electrode 24.

When the electricity is supplied, current passes through the epitaxial film 22. Because the epitaxial film 22 is bonded to the permanent substrate 21 through the peaks 226 that are randomly formed, the current passing through the epitaxial film 22 is forced to be shunted through the randomly formed peaks 226 to reach the permanent substrate 21. Accordingly, photons (the light) may be generated through the photoelectric effect more evenly in the epitaxial film 22 so as to improve internal quantum efficiency of the LED 2.

When light is generated from the epitaxial film 22, one portion of the light that is directly emitted to the roughened upper surface 224 is able to be transmitted therethrough in a relatively high proportion due to roughness of the same. Another portion of the light that is emitted to the roughened lower surface 225 is able to be transmitted therethrough in a relatively high proportion due to roughness of the same and then is reflected back to the roughened upper surface 224 by virtue of the optical adhesive 23 and the reflective film 212 of the permanent substrate 21. Hence, the reflected light may pass through the roughened upper surface 224 in a relatively high proportion on account of the roughness of the same as well.

Figure 3:
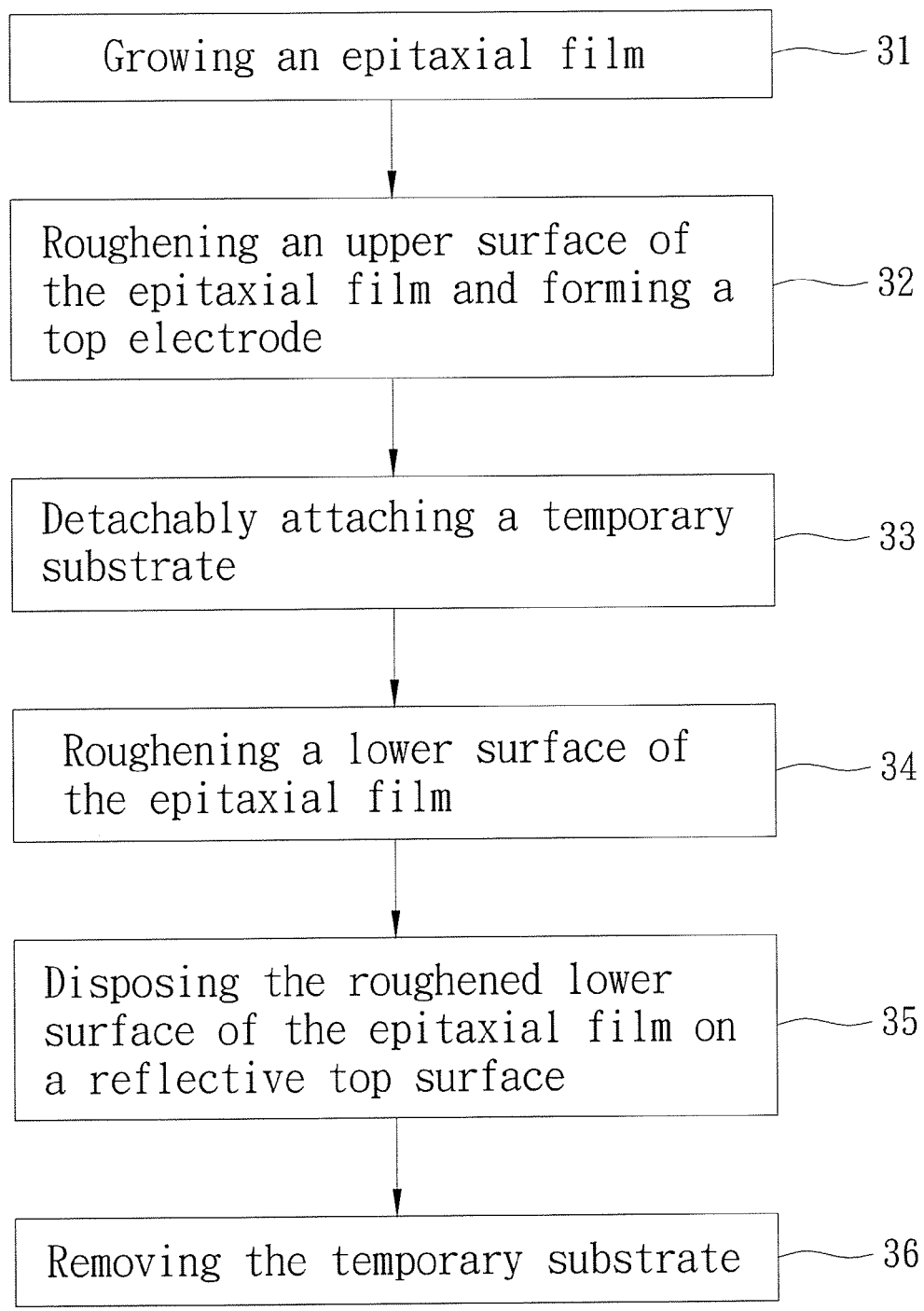
FIG. 3 is a flow chart to illustrate a method for forming a light emitting diode according to the present invention.

FIG. 3 illustrates a flow chart of a method for forming a light emitting diode according to the present invention.

Figure 4:
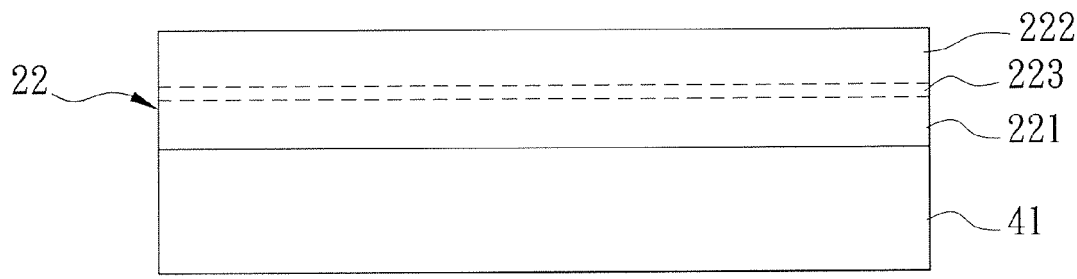
FIG. 4 is a schematic diagram illustrating that an epitaxial film is formed on an epitaxial substrate according to the method in FIG. 3.

In step 31, the epitaxial film 22 is grown epitaxially over the epitaxial substrate 41 (see FIG. 4).

Figure 5:
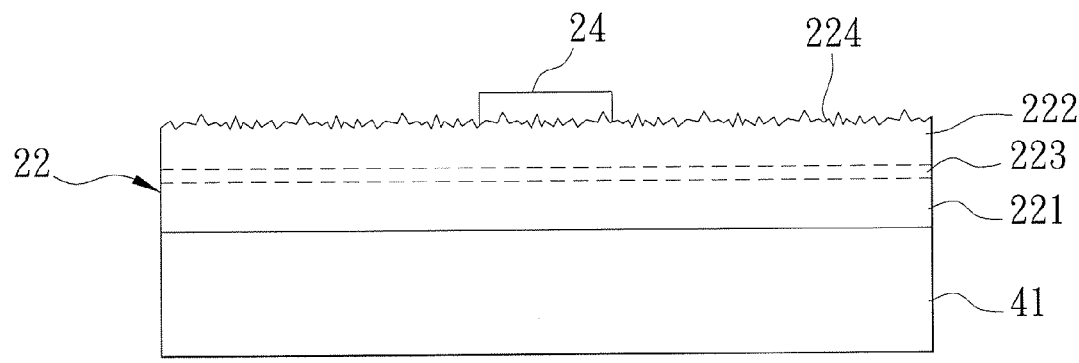
FIG. 5 is a schematic diagram illustrating that a top electrode is formed on a roughened upper surface of the epitaxial film according to the method in FIG. 3.

In step 32, the upper surface 224 of the epitaxial film 22 is roughened and then, the top electrode 24 is formed on the roughened upper surface 224 of the epitaxial film 22 (see FIG. 5). By virtue of the roughened upper surface 224, full reflection of the light generated from the epitaxial film 22 can be reduced.

In step 33, the temporary substrate 42 is detachably attached over the roughened upper surface 224 of the epitaxial film 22 that is formed with the top electrode 24, followed by removing the epitaxial substrate 41 to expose the lower surface 225 of the epitaxial film 22 that is opposite to the upper surface 224 (see FIG. 6).

In step 34, the lower surface 225 of the epitaxial film 22 is roughened (see FIG. 7) so that the roughened lower surface 225 has the roughness with the height of not less than 300 nm and the peaks 226. In this preferred embodiment, the lower surface 225 is randomly roughened. Alternatively, by patterning the epitaxial substrate 41 before the step 31, the lower surface 225 of the epitaxial film 22 may have a predetermined roughness after removal of the epitaxial substrate 41.

In step 35, the roughened lower surface 225 of the epitaxial film 22 is disposed on the reflective top surface 213 of the permanent substrate 21, and the optical adhesive 23 is filled in the gap between the roughened lower surface 225 of the epitaxial film 22 and the reflective top surface 213 of the permanent substrate 21 (see FIG. 8). In more detail, the permanent substrate 21 and the epitaxial film 22 are adhesively bonded to each other by an adhesive bonding process at the temperature ranging from 180° C. to 200° C.

In step 36, the temporary substrate 42 is removed from the epitaxial film 22 to obtain the LED 2.

Since the connection between the permanent substrate 21 and the epitaxial film 22 and the ohmic contact between the peaks 226 of the roughened lower surface 225 with the reflective top surface 213 can be achieved using the optical adhesive 23 in a relatively low-temperature process, the conventional high-temperature wafer bonding process (200° C.~400° C.) is not necessary. Accordingly, the quality degradation problem suffered by the reflective film 112 in the prior art due to the high temperature wafer bonding process can be eliminated and the light emitting efficiency of the LED 2 of this invention can be improved.

On the other hand, if the bonding strength between the permanent substrate 21 and the epitaxial film 22 is required to be at a strictly high extent, during the step 35, the peaks 226 may be wafer-bonded to the reflective top surface 213 of the permanent substrate 21 in addition to the adhesive bonding process. Consequently, the ohmic contact between the peaks 226 and the reflective top surface 213 may be enhanced without the strict requirement directed to the flatness of the lower surface 225 and the reflective top surface 213 as required in the prior art, and thus, the cost for producing the LED 2 of this invention may be reduced.

Figure 9:
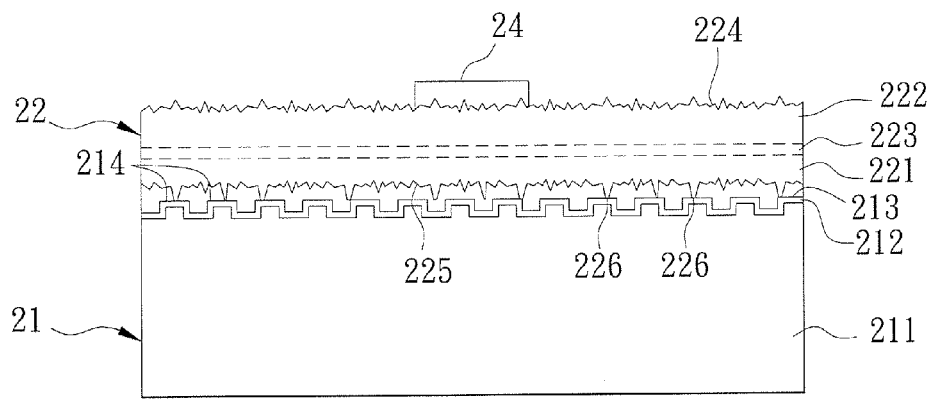
FIG. 9 is a schematic diagram of the second preferred embodiment of a light emitting diode according to the present invention.

FIG. 9 illustrates the second preferred embodiment of the LED 2 according to the present invention. The second preferred embodiment differs from the first preferred embodiment only in that the reflective top surface 213 has a plurality of protrusions 214 which are spaced apart from each other and in ohmic contact with the peaks 226 of the roughened lower surface 225. Through the connection between the protrusions 214 (artificial roughness) made using a lithography process and the peaks 26 (random roughness) made using a roughening process, when the electricity is supplied, the current passes through the epitaxial film 22 in a more uniform way so that the quantum efficiency and the light emitting efficiency of the LED 2 may be improved.

The protrusions 214 may be formed by forming a plurality of raised portions on the base plate 211, followed by forming the reflective film 212 on the base plate 211 in conformity with the topography of the same so that the protrusions 214 are formed by the raised portions and a portion of the reflective film 212. Alternatively, the protrusions 214 may be formed by patterning the reflective film 212 on the base plate 211 so that the protrusions 214 are formed by the patterned reflective film 212.

Figure 10:
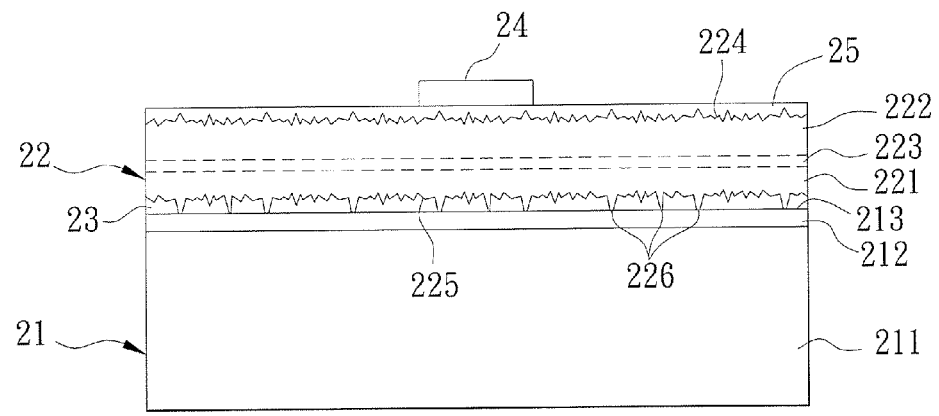
FIG. 10 is a schematic diagram of the third preferred embodiment of a light emitting diode according to the present invention.

FIG. 10 illustrates the third preferred embodiment of the LED 2 according to the present invention. The third preferred embodiment differs from the first preferred embodiment only in that the LED 2 further includes a transparent conductive film 25 formed between the epitaxial film 22 and the top electrode 24. In this preferred embodiment, the LED 2 is made by sputtering a transparent metal oxide (such as aluminum zinc oxides, indium tin oxides, fluorine tin oxides, etc.) on the roughened upper surface 224 to form the transparent conductive film 25, followed by disposing the top electrode 24 on the transparent conductive film 25 so that the transparent conductive film 25 is in ohmic contact with the top electrode 24. When the electricity is supplied, the current is transversely guided and dispersed by the transparent conductive film 25 and then passes through the epitaxial film 22. Accordingly, the current passes through the epitaxial film 22 in a more uniform way so that the quantum efficiency and the light emitting efficiency of the LED 2 may be improved.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A light emitting diode comprising:
    an electrically conductive permanent substrate having a reflective top surface;
    an epitaxial film configured to emit light and disposed on said reflective top surface of said permanent substrate, said epitaxial film having an upper surface and a roughened lower surface that is opposite to said upper surface, said roughened lower surface having a plurality of peaks, which are in ohmic contact with said reflective top surface, and a plurality of valleys, none of which are in ohmic contact with said reflective top surface;
    an optical adhesive filled in a gap between said roughened lower surface and said reflective top surface and connecting said epitaxial film with said permanent substrate while maintaining the ohmic contact of said peaks of said epitaxial film with said permanent substrate such that a substantial portion of a current passes through said peaks; and
    a top electrode disposed on said upper surface and in ohmic contact with said epitaxial film.

2. The light emitting diode of claim 1, wherein said peaks are in ohmic contact with said reflective top surface through wafer bonding.

3. The light emitting diode of claim 1, wherein said permanent substrate includes a base plate and a reflective film formed on said base plate to have said reflective top surface.

4. The light emitting diode of claim 3, wherein said reflective top surface has a plurality of protrusions that are spaced apart from each other and that are in ohmic contact with said peaks.

5. The light emitting diode of claim 1, further comprising a transparent conductive film formed between said epitaxial film and said top electrode.

* * * * *